United States Patent [19]

Frankel et al.

[11] Patent Number: 4,870,668
[45] Date of Patent: Sep. 26, 1989

[54] GAP SENSING/ADJUSTMENT APPARATUS AND METHOD FOR A LITHOGRAPHY MACHINE

[75] Inventors: Robert D. Frankel, Rochester, N.Y.; Marc J. Martin, Northboro, Mass.; David G. Baker, Worcester, Mass.; Thomas L. Duft, Franklin, Mass.

[73] Assignee: Hampshire Instruments, Inc., Rochester, N.Y.

[21] Appl. No.: 139,637

[22] Filed: Dec. 30, 1987

[51] Int. Cl.[4] .............................................. G21K 5/00
[52] U.S. Cl. ..................................... 378/34; 378/205; 250/491.1
[58] Field of Search ............................ 378/34.35, 205; 250/492.2 R, 491.1, 492.1; 355/55

[56] References Cited

U.S. PATENT DOCUMENTS

| 4,444,492 | 4/1984 | Lee | 355/55 |
| 4,475,223 | 10/1984 | Taniguchi et al. | 250/491.1 |
| 4,516,253 | 5/1985 | Novak | 378/34 |
| 4,525,852 | 6/1985 | Rosenberg | 378/34 |
| 4,538,069 | 8/1985 | Shambroom et al. | 250/491.1 |
| 4,613,981 | 9/1986 | Siddall et al. | 378/34 |
| 4,694,477 | 9/1987 | Siddall | 378/34 |

OTHER PUBLICATIONS

McCoy, John H., *Mask Alignment for the Fabrication of Integrated Circuits Using X-Ray Lithography*, Solid State Technology, Sep. 1976, pp. 59-64.

*Primary Examiner*—Carolyn E. Fields
*Assistant Examiner*—Joseph A. Hynds
*Attorney, Agent, or Firm*—Harry W. Barron

[57] ABSTRACT

A step and repeat mechanism is used with an X-ray lithography system for moving a wafer to be exposed from position to position beneath the source of x-rays. The step and repeat mechanism includes, means for moving the wafer to be exposed with six degrees of freedom. Conventional drive motor means move the step and repeat mechanism, and wafer held thereby, in the X, Y and Z linear directions, as well as rotates, tip and tilt the wafer in the planar direction. In addition, the system includes, three fine Z motor assemblies for moving the wafer in fine increments in the Z direction, which motor assemblies are used to tip and tilt the plane of the wafer. Sensors are included for determining the plane of the mask and the plane of each of the various sections of wafer to be exposed, so that appropriate tip and tilt adjustments by the three fine Z motor assemblies can be made to cause the average plane of each section of the wafer to be exposed to be parallel to the plane of the mask. All of the moving mechanisms, with the exception of the Y direction moving mechanism, are affixed the same level of the step and repeat mechanism. Included in the mechanism is a substage plate which is adjusted by the three triangularly positioned fine Z motor assemblies.

24 Claims, 5 Drawing Sheets

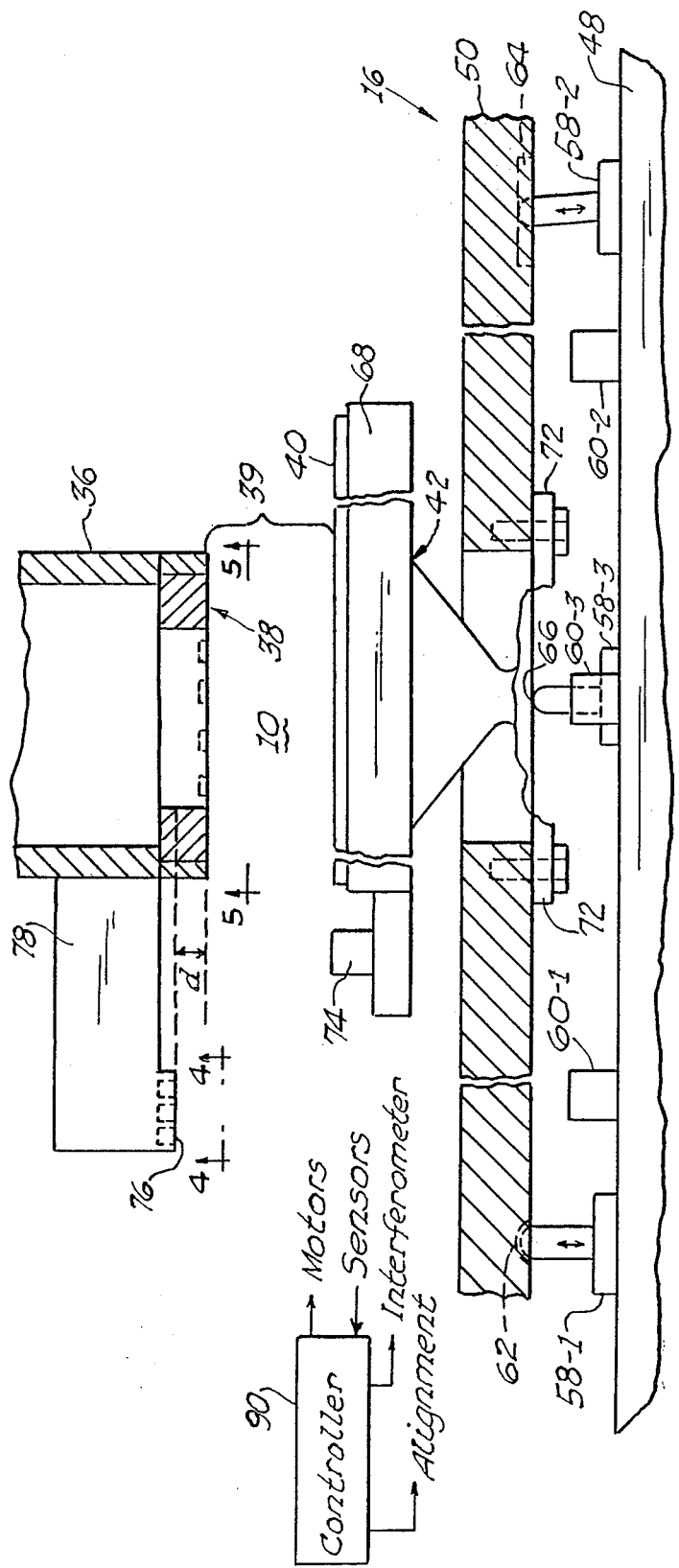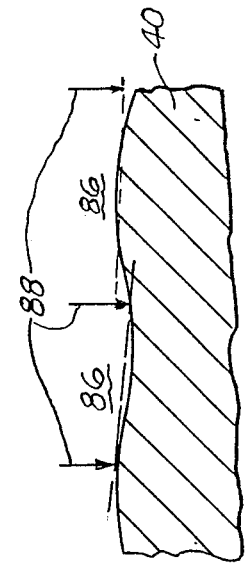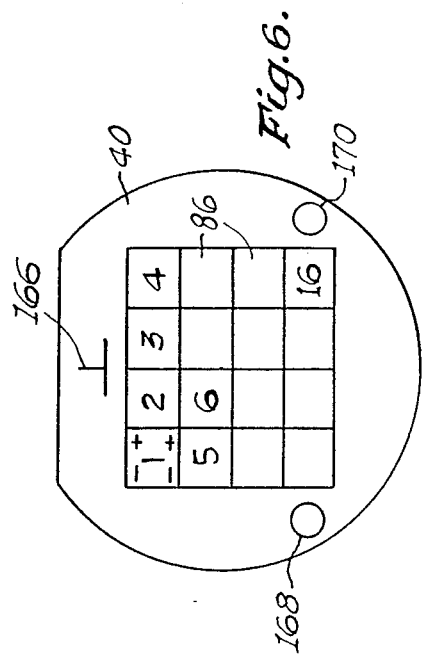

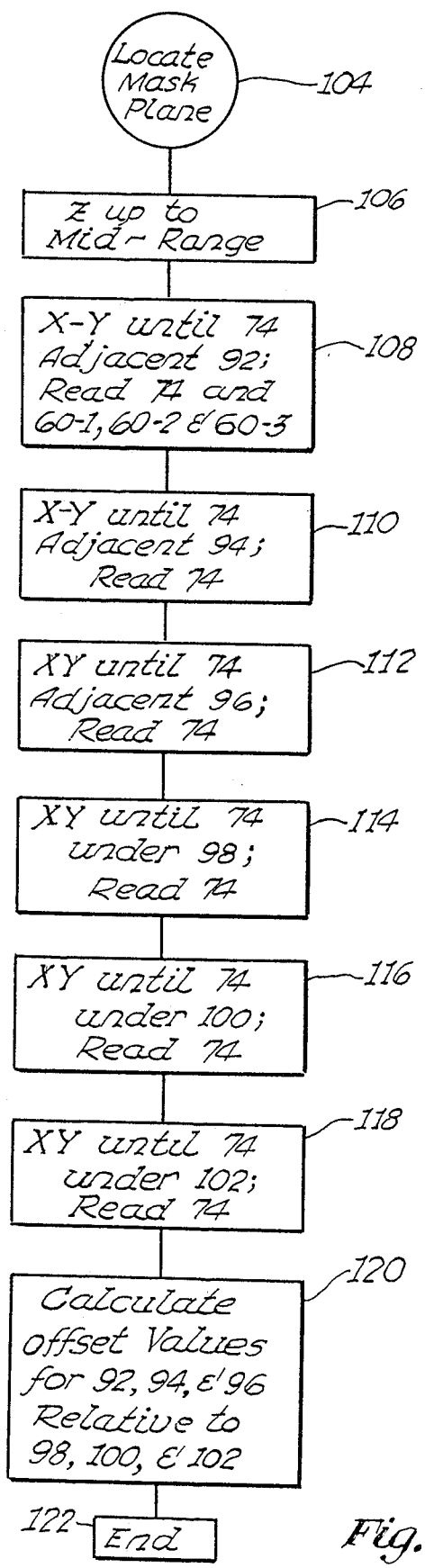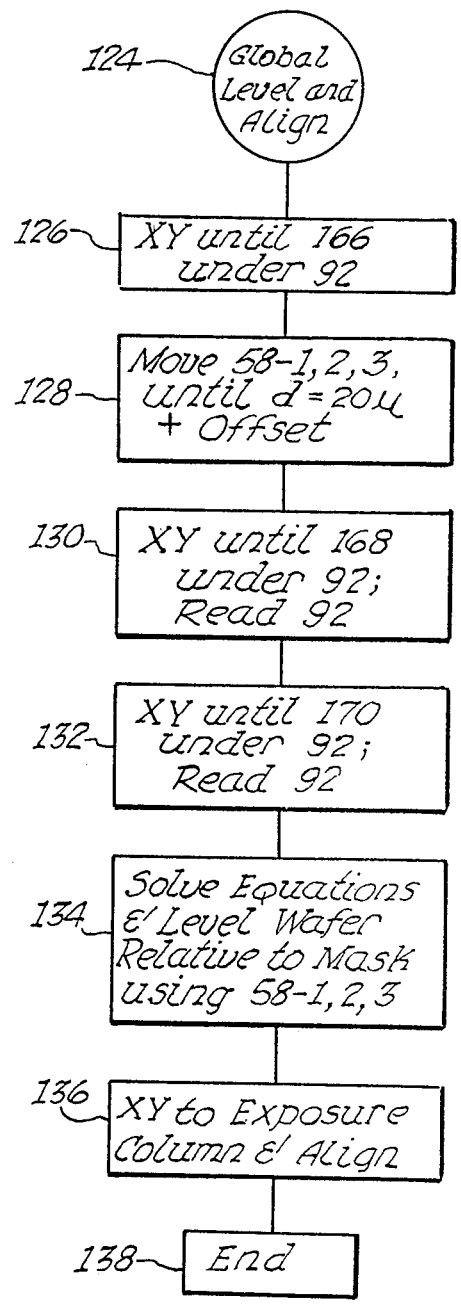
Fig. 8.
Fig. 9.

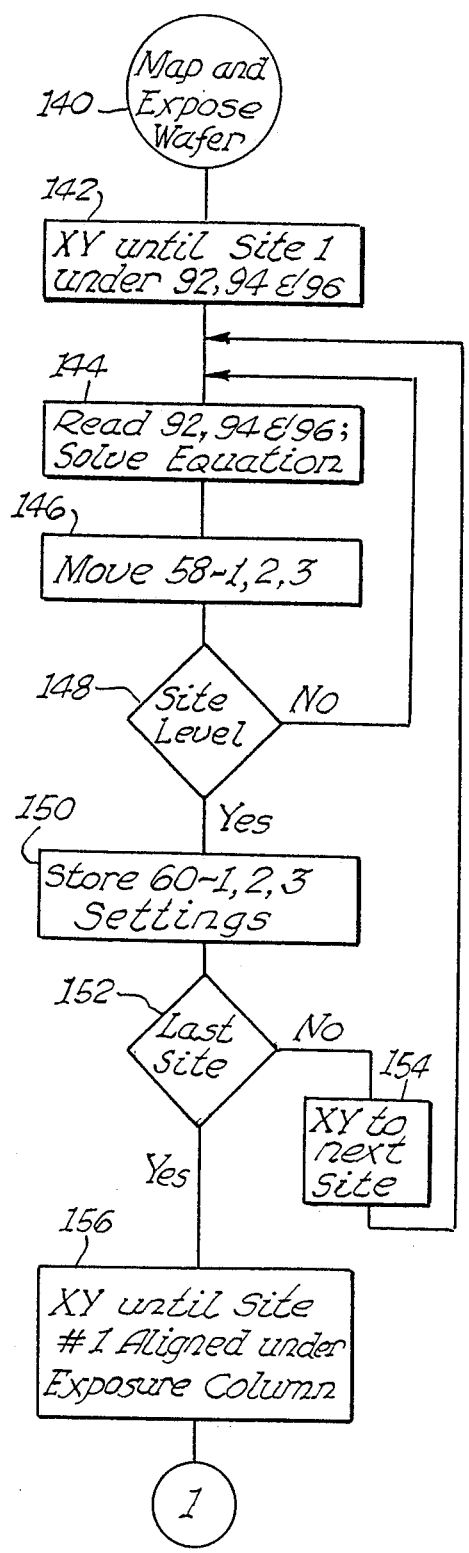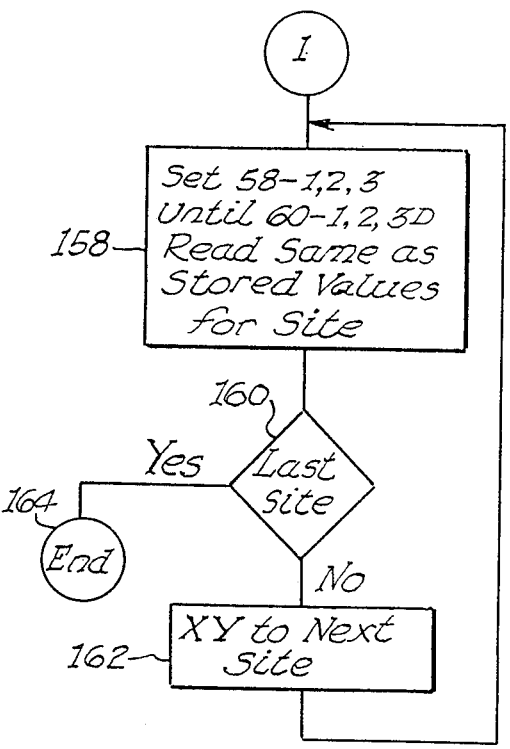
Fig. 10.

GAP SENSING/ADJUSTMENT APPARATUS AND METHOD FOR A LITHOGRAPHY MACHINE

This invention relates to apparatus and a method for maintaining the mask to wafer gap constant in a X-ray lithography machine, and more particularly, for adjusting the plane of the wafer on a section by section basis so as to compensate for nonplanar variations of the wafer.

For many years, semiconductor chips have been fabricated utilizing an ultraviolet light lithography machine to expose a pattern on a photoresist covered wafer. Typical state-of-the-art commercial wafers have a diameter of between three and eight inches. Since the area of the wafer which desirably can be reliably exposed at any given time is substantially less than the size of the wafer, the wafer is moved in incremental steps across an exposure area. typically during each step, the same pattern of light, defined by a mask or reticle, is applied to and exposes a photoresist layer covering the wafer. After the entire wafer has been moved in incremental steps past the exposure area, each section of the wafer will have been identically exposed. An example of such a step and repeat photolithography system is described in U.S. Pat. No. 4,444,492 in the name of Martin E. Lee. Apparatus similar to the step and repeat photolithography system described in the aforementioned Lee patent has been incorporated in the commercial products sold by Ultratech Stepper Corporation in its models 900 and 1000.

Historically, the requirements on the semiconductor industry has been to fabricate smaller and smaller features on each chip, so that correspondingly more and more semiconductor devices can be placed on each chip. Recently, the feature size being fabricated has reached the limits of conventional ultraviolet photolithography machines. More specifically, the size of features which can be placed on a semiconductor wafer is limited by the wavelength of the energy used to expose the resist. In the case of ultraviolet light, this limit is approximately one micron in size. In order to fabricate semiconductors devices with feature sizes of less than one micron, and still have acceptable yields, it is necessary to utilize an energy source with a wavelength shorter than ultraviolet light. Soft X-rays appears to be the best candidate for such a source.

When fabricating features of less than one micron on a semiconductor wafer, other problems are also created. These other problems include the registration and alignment accuracy requirements placed upon the stepper stage carrying the wafer from position to position beneath the exposure area. It is not sufficient to merely reduce the size of each of the steps of the stepper stage in order to increase the accuracy. As the features become smaller and smaller, other considerations must be taken into account, such as the unevenness of the wafer surface itself. For example, see Underhill et al. "Wafer flatness as a contributor to defocus and to submicron image tolerance in step-and-repeat photolithography", J. Vac. Sci. Technol. B5(1), (Jan/Feb 1987). In certain types of X-ray lithography systems, such as the type originally described by Nagel et al. in U.S. Pat. No. 4,184,078 and further described by Forsyth et al. in U.S. Pat. Nos. 4,692,934 and 4,700,371, the gap distance between the X-ray mask and the resist covered surface of the wafer is critical to proper operation. With respect to this gap distance, it is desirable to have each section of the wafer, when being exposed, evenly spaced from the mask over the entire exposure area. In other words, it is necessary to maintain the plane of the exposure side of the wafer parallel with the plane of the mask.

Other registration and alignment problems also must be solved when fabricating submicron images on semiconductor wafers. Many of these problems relate to the mechanical structure of the step and repeat mechanism itself. All step and repeat mechanisms must be capable of moving the wafer with six different degrees of freedom. These are linear movements in the X, Y, and Z directions, as well as tip, tilt and theta rotational motions about each of these axis. As used herein, "tip" means rotation about the x-axis direction, "tilt" means rotation about the y-axis direction, and "theta" refers to rotation about the z-axis direction.

In the past, the controlling mechanisms for moving the wafer in the various degrees of freedom have been positioned without considering the effect that movement in one degree has on the overall position, registration and alignment of a particular section of the wafer. For example, precise X and Y distances and hence position, can be measured utilizing an interferometer device. In the past, the interferometer has been mounted on the stepper mechanism well below the plane of the wafer. Thus, any tipping or tilting while adjusting the plane of the wafer, resulted in a slight X or Y error, known as Abbe error, being introduced at the point of exposure. This error was not accurately detected by the interferometer due to its position well below the plane of the wafer.

In accordance with one aspect of this invention, there is provided an improvement in a stepper system for a lithography machine of the type used to expose a pattern on a resist covered semiconductor wafer, one section at a time, which stepper system includes means for holding the wafer, means for holding a pattern defining mask in a given plane, means for moving the wafer holding means past the mask in integral steps such that one section at a time of the wafer becomes aligned with the mask, and means for directing energy through the mask to expose the pattern on the aligned section of the wafer. The improvement includes means for determining the average plane of each section of the wafer relative to the given plane and means, responsive to the means for determining, for adjusting the plane of the wafer as each section of the wafer becomes aligned with the mask to cause that aligned section to be in a desired relationship to the given plane.

One preferred embodiment of the subject invention is hereafter described, with specific reference being made to the following Figures, in which:

FIG. 3 is a diagram of the upper portion of the step and repeat mechanism and the lower portion of the exposure column and is useful in understanding the operation of one aspect of the subject invention;

FIG. 6 is a semiconductor wafer showing the position of the various exposure sections at which the lithography printing occurs;

FIG. 7 is an enlarged view of a semiconductor wafer showing two adjacent exposure sections and illustrating the variations in average planer alignment;

FIG. 8 is a flow diagram of an algorithm for the mask leveling function performed by the system shown in FIGS. 1 and 3;

FIG. 9 is a flow diagram of an algorithm for the global leveling and alignment of a wafer performed by the system shown in FIGS. 1 and 3; and FIG. 10 is a flow diagram of an algorithm for the section by section leveling and exposure of a wafer performed by the system shown in FIGS. 1 and 3.

Figure 1:
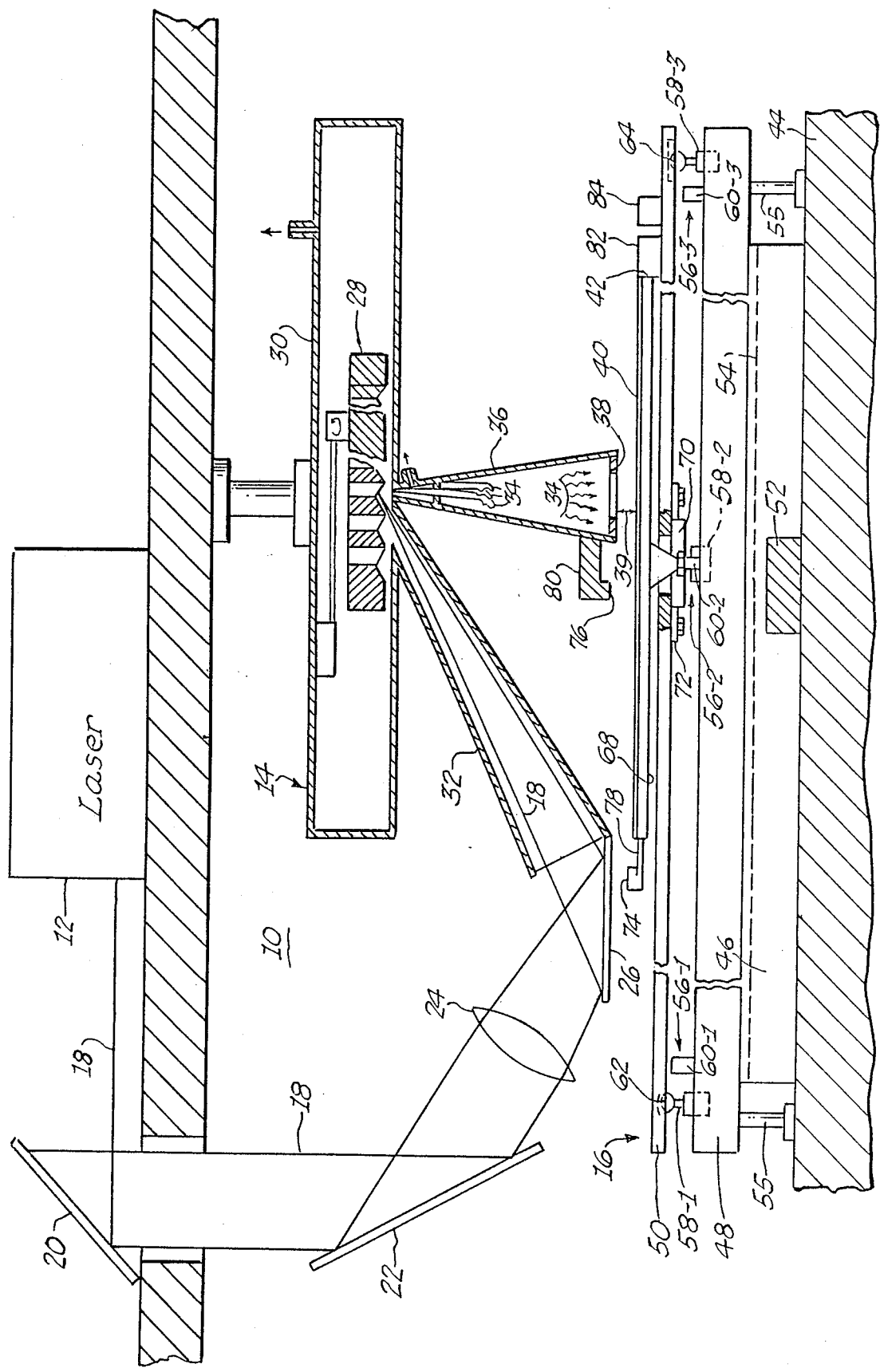
FIG. 1 is a diagram, particularly in cut-a-way, of an X-ray lithography machine utilizing the step and repeat mechanism of the subject invention.

Referring now to FIG. 1, an X-ray lithography machine 10 is generally shown and includes a high peak power and high repetition rate (one hertz) pulsed laser 12, an X-ray source 14, and a wafer handling mechanism 16 as the principal components of machine 10. Laser 12 provides a laser beam 18 which is directed by mirrors 20 and 22 and focused by lens 24 and finally directed by mirror 26 towards X-ray source 14. Laser beam 18 provided by laser 12 should be powerful enough to cause an X-ray emitting plasma to be formed when beam 18 is focused on a metal target.

X-ray source 14 includes a metal target 28 contained within an evacuated chamber 30. Laser beam 18 is provided through laser beam port 32, which is a part of evacuated chamber 30, and focused by lens 24 to a focal point on target 28. The intensity of laser beam 18 is sufficient to create an X-ray emitting plasma at the focal point on target 28 and the plasma, in turn, emits X-rays 34 into an exposure column 36. The broad concept of source 14 is shown in U.S. Pat. No. 4,484,339 in the name of Phillip J. Mallozzi et al and the particular structure for target 28 is more fully described in U.S. patent application Ser. No. 07/089,496 entitled "Mass Limited Target" in the name of Robert D. Frankel et al., which application is assigned to assignee hereof.

X-ray mask 38, which is positioned at the bottom of exposure column 36, is of a type which blocks certain X-rays 34 and permits the remaining X-rays 34 to pass therethrough, thereby providing a defined pattern of X-rays from the exposure column 36. Mask 38 may be of a type described in U.S. patent application Ser. No. 07/039,983 entitled "Compensated X-ray Mask" in the name of Irving Plotnik, which application is assigned to the assignee hereof.

Wafer handling mechanism 16 is of the type in which a semiconductor wafer 40 is held in a chuck 42 and moved in steps so that one exposure section 86 (seen in FIG. 6) at a time of wafer 40 is positioned beneath exposure column 36 to be exposed by the pattern of X-rays 34. In fabricating a semiconductor chip, many various series of operations on each exposure section 86 of wafer 40 are performed. Many of these operations include exposing a pattern on each exposure section 86 of wafer 40 followed by further processing that exposed pattern in a predetermined fashion. Except for the first layer, each pattern is exposed on top of a previously exposed and processed layer of wafer 40. It is extremely important that each new exposure section 86 be properly aligned with respect to the position of proceeding exposure section 86 in order that the fabricated chip operates properly.

Figure 2:
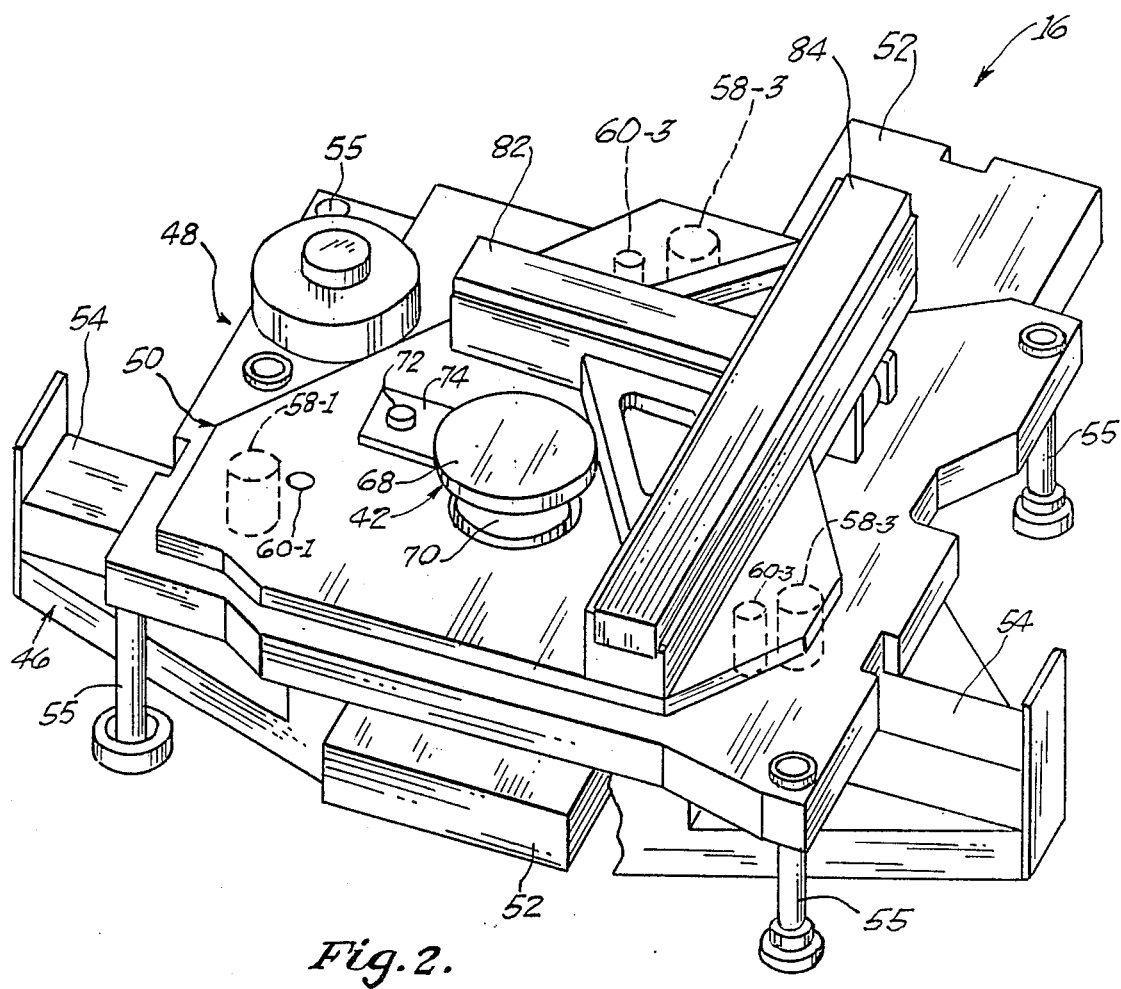
FIG. 2 is a prospective view of the step and repeat mechanism of the subject invention.

In order to preform proper movement and alignment of each section 86 of wafer 40, wafer handling mechanism 16 must be capable of moving wafer 40 with six degrees of freedom. These six degrees of freedom include three linear directions, that is, the X direction, the Y direction, and the Z direction, and three angular directions. Mechanism 16 rides on a flat granite base 44 and includes a Y stage 46 and an X stage 48. Affixed above and to X stage 48 is a substage 50 upon which the control mechanisms for course Z, and the rotational movements are mounted. In addition, the interferometer mirrors 82 and 84 (shown in FIG. 2) are also mounted on substage 50. Substage 50 is affixed to X stage 48 and moves therewith in the X and Y directions.

Y stage 46 moves over granite base 44 in a direction determined by a guide 52 affixed to granite base 44. Guide 52 determines the Y direction and Y stage 46 moves back and forth along guide 52 in that determined direction. Y stage 46 has a guide 54 affixed thereto defining the X direction and X stage 48 moves along guide 54. Substage 50 is positioned above X stage 48 by three legs 56-1, 56-2 and 56-3, each of which includes a stepper motor assembly 58-1 through 58-3 and a sensor 60-1 through 60-3. The three motor assemblies 58-1 through 58-3 are independently controllable to raise or lower one triangular corner of substage 50 in the Z direction. Each assembly 58-1 through 58-3 shaft is precisely guided by means of flexure pivots (not shown). By moving each of the three motor assemblies 58-1 through 58-3 together, small incremental movements in the Z direction can be obtained. Hereafter, this is referred to as "Fine Z Movement". By moving one or two of the motor assemblies 58-1 through 58-3 individually, the tip and tilt degrees of freedom referred to earlier can be obtained.

Motor assemblies 58-1 through 58-3 are rigidly affixed in a vertical direction from the X stage 48. This causes a slight lateral movement of substage 50, relative to the fixed drive shafts of the motor assemblies 58-1 through 58-3, to occur during the tipping or tilting of substage 50. To permit this lateral movement, the shaft connecting motor assembly 58-1 to substage 50 includes a ball and socket coupling 62 designed to prevent any lateral movement. However, the coupling of the shaft from motor assembly 58-2 to substage 50 is a ball and vee grove coupling 64, designed to permit lateral movement in either the x- or y-direction only, and the coupling of the shaft from motor assembly 58-3 to substage 50 is a ball and flat coupling 66 (seen in FIG. 3), designed to allow lateral movement in either of the X or Y directions.

Y stage 46 moves along Y guide 52 by conventional driver means (not shown) in discrete steps and X stage 48 moves along guide 54 by similar conventional drive means (not shown). X stage 48 is held above Y stage 46 by four air bearings 55 extending down from the corners thereof. Air bearings 55 glide along granite base 44 in the direction defined by guide 54. By spacing the four air bearings 55 as far apart as possible, the slight variations in the plane of granite base 44 cause relatively small and repeatable tip and tilt changes in the wafer 40 held by chuck 42. Adjustments to the tip and tilt position of wafer 40 can then be made by the apparatus and techniques hereafter described.

Chuck 42 includes a chuck plate 68 for holding wafer 40 and a motor 70 for moving plate 68 in relatively large vertical increments (course Z). An activator, such as motor, 70 is affixed to the bottom of substage 50 by a flexure 72, such that, as motor 70 operates, the movement is perpendicular to substage 50. Motor 70 may be selected to move wafer chuck 42 upwards from its rest position to a typical displacement of 5 millimeters. A preferred embodiment of motor 70 is an air cylinder, or a solenoid. The fine Z movement is controlled by motor assemblies 58-1 through 58-3, which have incremental steps of 0.12 microns and a maximum range of 400 microns.

In order to properly position wafer 40 with respect to mask 38, a chuck sensor 74 and X-ray chamber sensor 76 are provided, each of which is coupled to the respective chuck 42 and exposure column 36 by respective brackets 78 and 80. The detailed construction of sensor 74 and 76 will be described hereafter with respect to FIG. 3 and the operation thereof will be described hereafter with respect to FIGS. 8 and 10.

The precise X and Y positions of wafer handling mechanism 16 can be determined by a interferometer device. Such a device is well known in the art and includes a light transmitting device (not shown), one of the Y mirror 82 or the X mirror 84, and a light receiving device (not shown). The interferometer device measures the accumulated Doppler shift between transmitted and received light beam and thereby determines very precise displacements. For example, the interferometer devices may measure relative X and Y distances in lithography system 10 in the order of 0.02 micron. The Y mirror 82 and X mirror 84 associated with the two interferometer devices are mounted on substage plate 50 very close to the same height as wafer 40. By mounting mirrors 82 and 84 in this position, any corresponding X and Y lateral movement at the wafer 40 exposure plane due to the tip and tilt adjustment by fine Z motor assemblies 58-1 through 58-3 is monitored by the interferometer.

In addition, there is associated with coarse Z motor 70 means (not shown) for rotating the plate 68 to provide a rotational degree of freedom movement. Such means are well known in the art and are described in the aforementioned patent to Lee.

Referring now to FIGS. 3-7, the detailed manner in which mechanism 12 operates to properly position and align a section of wafer 40 with respect to mask 38 will now be described. Generally, in X-ray lithography systems, such as machine 10, the distance of the gap 39 between the mask 38 and wafer 40 is critical to the proper exposure of the resist layer on wafer 40. The plasma creating the X-rays within X-ray source 14 is extremely small and considered for purposes herein to be a point source. Thus, the X-rays are emitted in a cone from the point source and those X-rays which pass through the X-ray transmissive portion of mask 38 continue expanding away from the axis of the cone. In order to regulate magnification, the gap 39 distance between mask 38 and wafer 40 should be maintained small and constant.

The size of the features which may be exposed on wafer 40 using an X-ray energy source is 0.5 micron or less in size. With this small feature size, it is necessary that precise alignment be maintained between the wafer 40 and mask 38 and any change in magnification caused by variations in the gap 39 between mask 38 and wafer 40 must be kept to a minimum. For example, if the gap 39 is set to be 20 microns, it should not vary by more than 0.25 microns at any point from mask 38. With such a small tolerance available for the gap 39 distance, one must consider the flatness of wafer 40 itself.

In using a step and repeat handling mechanism, such as mechanism 16, the wafer 40 is broken down into various exposure sections 86, which will be exposed one at a time. In FIG. 6, a typical wafer is shown being broken into 16 different exposure sections 86, numbered 1 through 16. Each of these exposure sections 86 of wafer 40 is aligned beneath mask 38, one at a time, and each aligned section 86 is then exposed. Within each section, one or several semiconductor chips may be exposed. The limiting factor on each section is the size of the membrane portion of mask 38 which is transmissive to X-rays. The area of each exposure section 86 is significantly less than the size of wafer 40 which may be as much six or more inches in diameter. While a wafer 40 is generally considered to have a very flat surface, when view under extreme magnification, as seen in FIG. 7, the wafer 40 surface still varies slightly along the length thereof. The peak to valley variations may be as much as 2 microns. This difference may be significantly increased after many layers of resist material and further processing the wafer have occurred.

In FIG. 7, the arrows 88 define two adjacent exposure various sections 86 on wafer 40. As can be seen in FIG. 7, the average plane will vary between different exposure sections of wafer 40. If the third dimension had been shown in FIG. 7, different additional tip and tilt alignment of the plane would have been shown, based on the peaks and valleys of the wafer 40. Further, the uneven application of photoresist may increase the peak to valley variation in a wafer. Because of this unevenness along the top of wafer 40, it is necessary to adjust the gap 39 based on the average plane of each exposure section 86 of wafer 40. The apparatus heretofore described with respect to wafer handling mechanisms 16 is adapted to accomplish this adjustment.

Referring again to FIG. 3, sensors 60-1, 60-2 and 60-3, positioned between substage 50 and X stage 48, are each capacitive sensors which provide a voltage signal to controller 90. Controller 90 may be any conventional digital computer system with appropriate input/output devices, such as analog to digital converters, capable of receiving signal from and providing signals to different components, such as the sensors and motors, in mechanism 16. Sensor 74 is also a capacitive sensor and provides a voltage to controller 90. In the case of capacitive sensors 60-1, 60-2, 60-3 and sensor 74, the voltage provided thereby manifest the distance from the end of the sensor to a conductive object, such as substage 50 or a conductive portion on X-ray chamber sensor 76. For example, sensors 60-1, 60-2, 60-3 and 74 may be capacitive sensors manufactured and sold by ADE Corp. of Newton, Mass. under model number 3800 and are accurate sensing a distance to within 0.05 microns.

Figure 4:
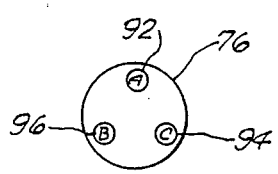
FIG. 4 is a view taken across lines 4—4 of FIG. 3.

The X-ray chamber sensor 76 include three air probe sensor 92, 94, and 96 positioned with respect to one another, as shown in FIG. 4. The distance between each sensors 92, 94, and 96 is selected so that all three sensors 92, 94, and 96 fit within an exposure section 86 of wafer 40. In the preferred embodiment, sensors 92, 94 and 96 are spaced as far apart as possible to still fit within one of the exposure sections 86. The air sensors 92, 94, and 96 operate by providing a flowing column of air against a solid surface, such as wafer 40, and measuring the back pressure of that column of air. The back pressure is a manifestation of the distance between the particular air sensor and the solid surface. Air sensor 92, 94, and 96 are accurate sensing a distance to within 0.05 microns.

Referring now to FIGS. 8, 9, and 10 the manner in which apparatus 16 operates to adjust the plane for each of the exposure sections 86 will now be described. The algorithms described with respect to FIGS. 8, 9, and 10 may be programed into controller 90, which controls the various components, such as the motors, sensors, alignment systems and interferometer, to perform the functions indicated by FIGS. 8, 9, and 10. In particular, controller 90 is coupled to read the values provided by sensors 60-1, 60-2, 60-3, 74, 92, 94, and 96. Further, controller 90 provides signals to and receive signals from the interferometer for precisely determining the exact X and Y position of mechanism 16 and controller 90 receives signals from the alignment systems (not shown) for aligning a particular section 86 of wafer 40 properly beneath mask 38. In response to these signals, controller 90 provides signals to control the various motors associated with mechanism 10, including the X direction motor and Y direction motor, theta motor, course Z motor 70, and the fine Z motor assemblies 58-1, 58-2 and 58-3.

Referring specifically to FIG. 8, the Locate Mask Plane algorithm 104 is executed one time after each new mask 38 is positioned against exposure column 36. A new mask 38 may be positioned by the use of the course Z motor 70. First the new mask 38 is prealigned and placed on plate 68, and the course Z motor 70 and fine Z motor assemblies 58-1, 58-2 and 58-3 raise chuck 42 until the mask 30 is approximately 20 microns beneath exposure column 36. After properly aligning the mask using the alignment system, a vacuum chuck is turned on and mask 38 is held in place, as illustrated in FIG. 3. While not shown in FIG. 3, air sensors may be included within exposure column 36 to assist in determining the 20 micron distances from column 36.

Once mask 38 is properly positioned in exposure column 36, algorithm 104, shown in FIG. 8, is executed to locate the plane of mask 38. Knowing the plane of mask 38, of course, is necessary in order to ultimately accomplish the goal of placing wafer 40 at a fixed gap 39 distance below mask 38. In order for the gap 39 distance to remain fixed, the plane of wafer 40 must be made parallel to the plane of mask 38.

Since mask 38 is a replaceable item, slight variations in the plane from mask to mask can be anticipated. Hence, it is necessary to determine the plane of mask 38 relative to a fixed structure within system 10 and this fixed structure is the plane of sensors 76. To do this, first, according to block 106 in algorithm 104, course Z motor 70 is moved to its upper position, and the fine Z motor assemblies 58-1, 58-2 and 58-3, are moved to their mid-range position. The exact position is not critical for the performance of the block 106 function. Next, according to block 108, the controller 90 provides signals to the X and Y drive motors and positions sensor 74 beneath a point adjacent to sensor 92 of sensors 76. At this point, the controller 90 reads the value provided by sensors 74, and sensors 60-1, 60-2 and 60-3. The reading for sensors 60-1, 60-2 and 60-3 is stored for future use to determine any drift which may occur over longer periods of time, including the time between the changes of mask 38.

Next, according to block 110, controller 90 provides signals to the X and Y drive motors until such time as sensor 74 is positioned adjacent to sensor 94. Again, controller 90 reads sensor 74 and stores the value. Finally, according to block 112, the X and Y drive motors move sensor 74 adjacent to sensor 96 and the sensor 74 value is again read and stored. At this point in time, three points adjacent to sensors 92, 94 and 96 on the plane of sensors 76 are known. These three points, thus, define a known physical plane within the system which remains constant over time. This defined plane can now be used as a reference plane from which other planes can be measured.

Figure 5:
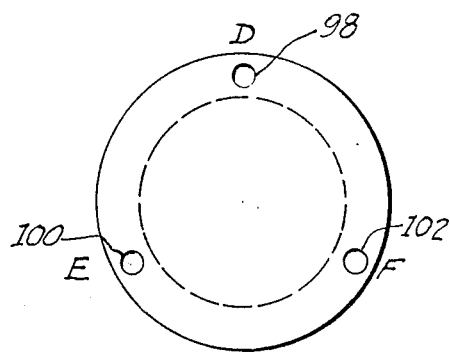
FIG. 5 is a view taken across lines 5—5 of FIG. 3.

Next according to blocks 114, 116 and 118, the X and Y drive motors are engaged to move sensor 74 beneath three points 98, 100 and 102 on mask 38. These points 98, 100 and 102 are seen in FIG. 5 and are ideally positioned near the outer edge of mask 38 at approximately equilateral angles. At the time sensor 74 is positioned beneath each of the points 98, 100 and 102, the voltage value provided sensor 74 is read and stored by controller 90.

Now, three points from the sensor 76 plane are known and three points from mask 38 plane are known. From this information as indicated by block 120, controller 90 calculates necessary offset values for sensors 92, 94 and 96 relative to the plane defined by the three points 98, 100 and 102 on mask 38. The calculated offset values permit sensors 92, 94 and 96 to indicate values of a plane parallel to the mask 38 plane. The calculated offset value for sensors 92, 94 and 96 must take into account both the mechanical difference between the sensors 92, 94 and 96 and the differences in alignment of the plane of sensors 92, 94 and 96 and the plane of mask 38. Further, the distance d, shown in FIG. 3 as that distance between the plane of sensors 92, 94 and 96 and the plane of mask 38, must be considered in calculating the offset value. By calculating these offset values, when the readings provided by the three sensors 92, 94 and 96 are added to the offset values, the plane of the object sensed (e.g. wafer 40) is parallel to the plane of mask 38. At this point, as indicated by block 122 the execution of the Locate Mask Plan algorithm 104 is complete.

After the mask plane is located, a wafer 40 is prealigned and placed on to plate 68 of chuck 42 for exposure by X-ray lithography system 10. Prior to exposing the resist layer of wafer 40, it is necessary to globally level and align, as indicated by algorithm 124 in FIG. 9. First, according to block 126, controller 90 directs the X and Y drive motors to operate until global alignment mark 166 of wafer 40 is beneath sensor 92. The global alignment mark 166, as well as two other arbitrary locations 168 and 170 are shown on wafer 40 in FIG. 6. Ideally these three locations 166, 168 and 170 are positioned near the edge of wafer 40 and spaced sufficiently far apart so the a global plane for wafer 40 can be determined. As will be described hereafter with respect to FIG. 10, the individual planes for each of the exposure sections 86 will be determined relative to the global plane.

After global alignment mark 166 is positioned beneath sensor 92, then, according to block 130, the fine Z motors 58-1, 58-2 and 58-3 are moved until sensor 92 indicates that the distance to mark 166 on wafer 40 is equal to the ideal gap 39 distance of 20 microns. In making the determination of the gap 39 distance, the offset value calculated at block 120 for sensor 92 is utilized. Next, according to blocks 130 and 132 and X and Y drive motors are engaged until points 168 and 170 are positioned beneath sensor 92 and the sensor 92 value is read. At this point, three values, which may be different, have been read for the three points 166, 168 and 170 on wafer 40. Each of these values represent a different distance relative to the desired 20 micron gap 39 distance. Next, as indicated by block 134, a set of three equations are solved in order to determine the three settings for fine Z motor assemblies 58-1, 58-2 and 58-3 in order that the global plane of wafer 40 is parallel to the plane of mask 38. These equations are as follows:

$P1 = r1 \cdot q1 + r2 \cdot q2 + r3 \cdot q3$
$P2 = s1 \cdot q1 + s2 \cdot q2 + s3 \cdot q3$
$P3 = t1 \cdot q1 + t2 \cdot q2 + t3 \cdot q3$ where P1, P2, P3 are the measured distance from the sensor 92 to wafer 40, at the three points 166, 168 and 170; r, s, t are functions of mechanism 16 and sensor 92 geometry and are known constants for each machine 10; and q1, q2, q3 are the distance that each motor assembly 58-1, 58-2 and 58-3 must be moved to bring about the required change in wafer 40 to air sensor 92 distance so that the global plane of wafer 40 is parallel to mask 38.

After the above three equations are solved, the values of q1, q2 and q3 will be known. At this point, controller 90 sends proper signals to each of motor assemblies 58-1, 58-2 and 58-3 to cause fine Z movement, such that the globally defined plane of wafer 40 is made parallel to the plane of mask 38. Then, according to block 136, controller 90 transmits signal to the X and Y drive motors to cause wafer 40 to be moved beneath exposure column 36 and properly aligned therewith. At this point, as indicated by block 138, the Global Level and Align algorithm is completed.

Referring now to FIG. 10, XRL system 10 is almost ready to begin exposing the photoresist layer of wafer 40. However, before this can be done, it is necessary to determine the specific plane of each of the exposure sections 86 of wafer 40, in as much as these individual sections 86 may have a somewhat different plane that the global plane of wafer 40. Thus, the Map And Expose Wafer Algorithm is executed. First, according to block 142, controller 90 generates signals to the X and Y drive motors to cause site 1 to be moved under sensors 92, 94 and 96. Next according to block 144, the values provided by sensors 92, 94 and 96 are read and the offset values from block 120 added and the equations, described above with respect to block 134, are again solved for the plane of site 1. At this point, as indicated at block 146, motor assemblies 58-1, 58-2 and 58-3 are issued commands to level site 1 with respect to the mask plane.

Next, according to block 148, a determination is made whether the site is level. This determination can be quickly made by determining whether the offset adjusted values provided by the sensors 92, 94 and 96 are the same as these calculated. If not, the function at blocks 144 and 146 is repeated. If the site is level, then according to block 150, the values of sensors 60-1, 60-2 and 60-3 are stored for later use. Next, according to block 152, a determination is made whether the last site has been leveled. If not, then according to block 154, the X and Y drive motors move wafer 40 so that the next site is beneath sensors 92, 94 and 96 and the next site is leveled beginning with block 144, as just described.

If at block 152, it was determined that the last site had been leveled, then according to block 156 the X and Y drive motors move site 1 beneath the exposure column 36. Site 1 is then aligned with mask 38 and according to block 158, fine Z motor assemblies 58-1, 58-2 and 58-3 are set so that the sensor 60-1, 60-2 and 60-3 associated therewith read the same as the values stored for site 1 with respect to block 150. With this setting, site 1 is parallel to and the proper gap 39 distance from mask 38. At that point, controller 90 generates commands to cause the laser 12 to provide laser beam 18 causing X-rays to be generated and site 1 to be exposed.

Next, according to block 160, a determination is made whether the last site has been exposed. If not, controller 90 issues commands to cause the X and Y drive motors to move and align the next site beneath the exposure column and block 158 is repeated for the next site. When, at block 160, the determination is made that the last site was exposed the Map And Exposed Wafer algorithm ends, as indicated by block 164, and wafer 40 is removed and a new wafer is placed on plate 68 for further processing. The new wafer 40 must then be globally leveled and aligned and each site thereof must be leveled and aligned before being exposed.

What is claimed is:

1. In a stepper system for a lithography machine of the type used to expose a pattern on a resist covered semiconductor wafer, one section at a time, said wafer having a plurality of sections, said stepper system including means for holding said wafer, means for holding a pattern defining mask in a given plane, means for moving said wafer holding means past said mask in integral steps, such that one section at a time of said wafer becomes aligned with said mask, and means for directing energy through said mask to expose said pattern on said aligned section of said wafer, the improvement comprising:
   means for determining the average plane of each section of said wafer relative to said given plane; and
   means, in response to said means for determining, for adjusting the plane of said wafer, as each section of said wafer becomes aligned with said mask, to cause that aligned section to be in a desired relationship to said given plane.

2. The improvement according to claim 1 wherein said desired relationship is the average plane of said section being parallel to said given plane.

3. The improvement according to claim 2 wherein said means for determining further determines the average plane of said mask as said given plane.

4. A step and repeat mechanism for a lithography system of a type used to fabricate semiconductor devices, said system including a source of energy, mask holding means for holding a pattern defining mask towards which said energy is directed, a mechanism, including wafer holding means and moving means, for moving a wafer to be patterned in discrete steps past said mask and aligning one section at a time of said wafer with said mask, said mechanism comprising:
   three separated first sensors affixed to said mask holding means, said three first sensors being positioned to be within an area corresponding to the area of each wafer section;
   a second sensor affixed to said wafer holding means;
   three separated vertical motor means affixed between said moving means and said wafer holding means for adjusting the plane of said wafer holding means with respect to said moving means; and
   control means for controlling said moving means, said three first sensors, said second sensor and said three motor means to position each section of said wafer beneath and parallel to said mask.

5. The mechanism according to claim 4:
   wherein said wafer holding means includes a plate; and
   wherein each motor means is positioned between said moving means and said plate for adjusting the plane of said plate upon command of said control means.

6. The mechanism according to claim 5 wherein said control means controls said motor means independently in response to signals provided from said three first sensors and said second sensor.

7. The mechanism according to claim 4 wherein said control means controls said motor means independently in response to signals provided from said three first sensors and said second sensor.

8. The mechanism according to claim 4:
wherein each of said sensors provides a signal to said control means manifesting the distance from that sensor to another object;
wherein said control means provides signals to said moving means to move said second sensor to three separated first desired positions with respect to each of said first sensors, said second sensor providing a signal to said control means when at each of said three first desired positions manifesting the distance from said second sensor to that first desired position; and
wherein said control means provides signals to said moving means to move said second sensor to at least three separated second desired positions with respect to said mask, said sensor providing a signal to said control means when at each of said three second desired positions manifesting the distance from said second sensor to each second desired position.

9. The mechanism according to claim 8 wherein said control means calculates relative offset values for said first sensors based upon the relative differences in the signals provided to said control means by said second sensors when at said first and second desired positions.

10. The mechanism according to claim 9 wherein said control means provides a signal to said moving means to move to a first predetermined location of said wafer a predetermined distance under one of said first sensors, said first predetermined distance being the desired distance between said mask and said wafer, plus the relative offset value, said control means thereafter moving, one at a time, second and third predetermined location of said wafer under said one first sensor and said one first sensor providing a signal to said control means manifesting the distance between said one first sensor and said respective second and third predetermined locations.

11. The mechanism according to claim 10 wherein said control means calculates the global plane of said wafer in response to said one first sensor signals manifesting the distance between said one first sensor and said respective second and third predetermined locations and provides signals to said motor means to globally level said wafer with respect to said first sensors.

12. The mechanism according to claim 11 wherein said control means provides a signal to said moving means to move to a first section of said wafer beneath said three first sensors, said three first sensors providing signals to said control means manifesting the distance between each first sensor and said first section.

13. The mechanism according to claim 12:
wherein said control means calculates the plane of said first section in response to said three first sensors signals manifesting the distance between each first sensor and said first section;
wherein said control means provides signals to said moving means to move said first section into alignment with said mask; and
wherein said control means provides signals to said motors to level said first section with respect to said first sensors.

14. The mechanism according to claim 13 wherein said control means provides a signal to said moving means to move to a second section of said wafer beneath said three first sensors, said three first sensors providing signals to said control means manifesting the distance between each first sensor and said second section;
wherein said control means calculates the plane of said second section in response to said three first sensors signals manifesting the distance between each first sensor and said second section;
wherein said control means provides signals to said moving means to move said second section into alignment with said mask; and
wherein said control means provides signals to said motor means to level said second section with respect to said first sensors.

15. In a method for exposing a resist covered semiconductor wafer in which one of a plurality of sections at a time of said wafer is aligned with a pattern defining mask and energy is applied through said mask to expose said pattern on that aligned section, the improvement comprising the steps of:
determining the plane of each section of said wafer relative to the plane of said mask; and
adjusting the plane of said wafer, each time a section of said wafer is aligned with said mask, to cause the plane of that aligned section to be in a desired relation with respect to said given plane.

16. The method according to claim 15 wherein said desired relation is parallel.

17. The method according to claim 15 wherein said method further includes the step of determining the plane of said mask.

18. The method according to claim 15 wherein said step of adjusting includes storing data manifesting the relative position of three points in each section with respect to a known position.

19. The invention according to claim 15 wherein said step of determining includes the steps of locating the plane of said mask relative to a fixed plane and globally leveling said wafer with respect to the located mask plane.

20. The method according to claim 19 wherein said step of adjusting includes storing data manifesting the relative position of three points in each section with respect to a known position.

21. In a method for exposing a resist covered semiconductor wafer in which one section at a time of said wafer is aligned with a pattern defining mask and energy is applied through said mask to expose said pattern on that aligned section, the improvement comprising the steps of:
determining the plane of each section of said wafer relative to the plane of said mask;
adjusting the plane of said wafer, each time a section of said wafer is aligned with said mask, to cause the plane of that aligned section to be in a desired relation with respect to said given plane;
wherein said step of determining includes the steps of locating the plane of said mask relative to a fixed plane and globally leveling said wafer with respect to said located mask plane;
wherein said wafer is held by a mechanism which moves said wafer in the x, y and z linear directions and which rotates said wafer about the x, y and z axis, said mechanism having a first distance sensor positioned in fixed relationship to said wafer and a second distance sensor positioned in relationship to said fixed plane; and wherein said step of locating includes:
- moving said mechanism in the x and y directions, when at a predefined z position, so that said first sensor is in a predetermined relationship, one at a time, with three predefined points on said fixed plane and reading the distance sensed by said first sensor at each of said three points,
- moving said mechanism in the x and y directions, when at said predefined z position, so that said first sensor is in a predetermined relationship, one at a time, with three predefined points on said mask, each of said predetermined mask points being paired with one of said fixed plane points, and
- calculating the offset distance between said fixed plane and mask for each of said three points pairs.

22. The method according to claim 21 wherein said step of globally leveling includes the steps of:
- moving said mechanism in the x and y directions, when at a second predefined z position, so that said second sensor is in a predetermined relationship, one at a time, with three spaced apart points on said wafer and reading the distance sensed by said second sensor at each of said three points;
- moving said wafer plane around said x axis and said y axis until said wafer plane is parallel to said mask plane.

23. The method according to claim 22:

wherein said wafer has a plurality of predefined and presized sections, each of which is to be exposed;

wherein said second sensor includes three triangularly positioned individual sensors for providing a signal manifesting the distance from said sensor to a fixed point, said three sensors being positioned with respect to one another to fit within one section of said wafer;

wherein said step of adjusting includes the steps of moving said mechanism in the x and y directions, while at said a second predefined z position, until said three second sensors are within one section of said wafer, rotating the planar position about said x axis and said y axis of said wafer, storing data manifesting the position of said wafer plane, and moving said mechanism in the x and y directions until said section is aligned with said mask and setting said plane of said wafer in response to said stored data.

24. The method according to claim 23:

wherein said steps of moving said mechanism in the x and y directions until said three second sensors are within one section of said wafer, rotating the planar position about said x axis and said y axis of said wafer, and storing data manifesting the position of said wafer plane are repeated for each section of said wafer prior to said step of moving said mechanism in the x and y directions until said section is aligned with said mask; and wherein said step of moving said mechanism in the x and y directions until said section is aligned with said mask and setting said plane of said wafer in response to said stored data is repeated for each section of said wafer.

* * * * *